US009305981B2

(12) United States Patent
Furuie

(10) Patent No.: US 9,305,981 B2
(45) Date of Patent: Apr. 5, 2016

(54) ORGANIC ELECTRO-LUMINESCENT DEVICE

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/471,063

(22) Filed: Aug. 28, 2014

(65) Prior Publication Data

US 2015/0060823 A1  Mar. 5, 2015

(30) Foreign Application Priority Data

Aug. 29, 2013  (JP) ................. 2013-178678

(51) Int. Cl.
H01L 27/32 (2006.01)
H01L 27/28 (2006.01)
G02F 1/13 (2006.01)
G02F 1/1341 (2006.01)

(52) U.S. Cl.
CPC ......... *H01L 27/3223* (2013.01); *H01L 27/3244* (2013.01); *H01L 2251/562* (2013.01)

(58) Field of Classification Search
CPC ............ H01L 27/3223; H01L 27/3244; H01L 27/3246; H01L 2251/5315; H01L 27/3276; H01L 51/56; H01L 2227/323; H01L 27/3211
USPC .............. 349/111, 38, 42, 54, 44; 257/59, 72, 257/E21.413, E29.278; 438/103, 69
See application file for complete search history.

(56) References Cited

U.S. PATENT DOCUMENTS

| 5,285,301 | A  | * | 2/1994  | Shirahashi et al. | 349/143 |
| 6,157,429 | A  | * | 12/2000 | Miyawaki et al. | 349/138 |
| 6,259,500 | B1 | * | 7/2001  | Kijima et al. | 349/113 |
| 2002/0008800 | A1 | * | 1/2002 | Matsumoto et al. | 349/44 |
| 2003/0142043 | A1 |   | 7/2003 | Matsueda | |
| 2003/0155612 | A1 | * | 8/2003 | Kawachi et al. | 257/344 |
| 2004/0032554 | A1 | * | 2/2004 | Yoon et al. | 349/113 |
| 2005/0078240 | A1 | * | 4/2005 | Murade | 349/110 |
| 2005/0225708 | A1 | * | 10/2005 | Oke et al. | 349/139 |
| 2007/0241664 | A1 | * | 10/2007 | Sakamoto et al. | 313/503 |
| 2009/0073368 | A1 | * | 3/2009 | Wang et al. | 349/143 |
| 2009/0244465 | A1 | * | 10/2009 | Oyamada | 349/139 |
| 2014/0368481 | A1 | * | 12/2014 | Tomikawa, Naoki | 345/205 |
| 2015/0060823 | A1 | * | 3/2015 | Furuie | 257/40 |

FOREIGN PATENT DOCUMENTS

JP  2005-148335 A  6/2005
JP  2007-256968 A  10/2007

* cited by examiner

*Primary Examiner* — Mary Wilczewski
*Assistant Examiner* — Tsz Chiu
(74) *Attorney, Agent, or Firm* — Typha IP LLC

(57) ABSTRACT

A display device includes a display area in which pixels are arranged in a matrix, and an inspection area that is formed around the display area, and has an inspection pixel, in which the display area includes plural first electrodes that are disposed in the respective pixels, a light emitting organic layer that includes plural organic material layers having a light emitting layer, and a second electrode that covers the display area, and the inspection pixel includes an inspection first electrode electrically independent from the respective first electrodes, an inspection organic layer in which at least one light emitting layer of the plural organic material layers is continuous from the display area, and comes in contact with the inspection first electrode, and an inspection second electrode that is continuous from the second electrode, and comes in contact with the inspection organic layer.

8 Claims, 9 Drawing Sheets

ORGANIC ELECTRO-LUMINESCENT DEVICE

BACKGROUND OF THE INVENTION

1. Field of the Invention

The present invention relates to a display device.

2. Description of the Related Art

In recent years, an image display device (hereinafter referred to as "organic EL (electro-luminescent) display device") using self-emitting bodies called "organic light emitting diodes (OLED)" has been put into a practical use. As compared with a liquid crystal display device in a related art, the organic EL display device uses the self-emitting bodies, and therefore not only is excellent in visibility and response speed, but also does not require an auxiliary lighting device such as backlight. As a result, the organic EL display device can be further thinned.

Because an organic EL element used in the organic EL display device of this type is deteriorated when absorbing moisture, measures are taken to hermetically bond a sealing glass substrate onto a TFT (thin film transistor) substrate on which a light emitting layer is formed with resin in an organic EL panel.

JP 2005-148335 A discloses that in an evaporation mask in which plural openings for forming an organic light emitting layer are formed, since a shape of openings formed outside is changed by a stress, an opening as a dummy pixel is formed in a non-display area around a display area in the evaporation mask. JP 2007-256968 A discloses that a dummy pixel area is provided outside of the display area in a manufacturing stage for the purpose of equalizing film forming conditions for pixels in the display area.

SUMMARY OF THE INVENTION

In the TFT substrate, a sealing film is formed over a surface thereof so as to cover an overall surface of the display area and a peripheral circuit area. However, there has been known that if there is a defect in the sealing film, moisture of an outside air penetrates the defect to deteriorate the light emitting layer. If the defect of the sealing film is present within the display area, the defect can be detected as a dark spot in an inspection process. However, if the defect is present outside the display area (and inside a moisture block area to be described later), the defect cannot be immediately detected as the dark spot, and has the potential for display failure which is so-called "dark edge" in which lighting failure occurs from outside of the display area with time after coming on the market.

In order to prevent the dark edge from occurring in the market, it is conceivable that an aging process is conducted in a manufacturing process to confirm whether the dark edge is present, or not. However, this may cause an increase in the manufacturing cost to rise, and throughput degradation.

The present invention has been made under the above circumstances, and therefore aims at providing a display device that suppresses the manufacturing costs, and inhibits lighting failure from occurring after shipping.

According to the present invention, there is provided a display device, including: a display area in which pixels each having a light emitting area from which light is emitted are arranged in a matrix; and an inspection area that is formed around the display area, and has at least one inspection pixel, in which the display area includes: a plurality of first electrodes that are disposed in the respective pixels; a light emitting organic layer that comes in contact with the first electrodes in the light emitting area, and includes a plurality of organic material layers having a light emitting layer; and a second electrode that comes in contact with the light emitting organic layer, and covers the display area, and in which the inspection pixel includes: an inspection first electrode of the same layer as that of the plurality of first electrodes, and electrically independent from the plurality of first electrodes; an inspection organic layer in which at least one light emitting layer of the plurality of organic material layers is continuous from the display area, and comes in contact with the inspection first electrode; and an inspection second electrode that is continuous from the second electrode, and comes in contact with the inspection organic layer.

Also, according to the present invention, the display device may further include: a peripheral circuit area that is disposed around the inspection area, in which a circuit using a metal line and a thin film transistor is arranged; and a blocking area that includes an electrode layer which is formed between the inspection area and the peripheral circuit area, and continuous from the inspection second electrode in the inspection area, and includes only an inorganic material layer between the electrode layer and an insulating substrate which is a base material.

Also, in the display device according to the present invention, the inspection pixel may have the same size and the same shape as those of the pixels in the display area, and be arranged to fill the inspection area at the same intervals as that in the display area.

Also, in the display device according to the present invention, the inspection pixel may be larger than the pixels in the display area, and may fill the inspection area.

Also, in the display device according to the present invention, the display area may further include a reflective layer that reflects light emitted by the light emitting layer, and outputs the light in a first output direction from the first electrodes toward the second electrode in a side of the first electrodes opposite to the light emitting organic layer side, and a light shielding film that blocks light output in the first output direction may be arranged in only the blocking area and the peripheral circuit area of the inspection area, the blocking area, and the peripheral circuit area.

Also, in the display device according to the present invention, the display area may further include a reflective layer that reflects light emitted by the light emitting layer, and traveling toward a side of the first electrodes opposite to the light emitting organic layer side, and outputs the light in the first output direction from the first electrodes toward the second electrode, and the inspection pixel may have no layer corresponding to the reflective layer, and output the light in the first output direction, and in a second output direction from the second electrode toward the first electrodes.

Also, in the display device according to the present invention, the inspection area may further include a light shielding film that blocks the light output toward the first output direction.

Also, in the display device according to the present invention, the inspection first electrode of the inspection pixel may be electrically connected to the inspection first electrode of another inspection pixel adjacent thereto.

DETAILED DESCRIPTION OF THE INVENTION

Figure 1:
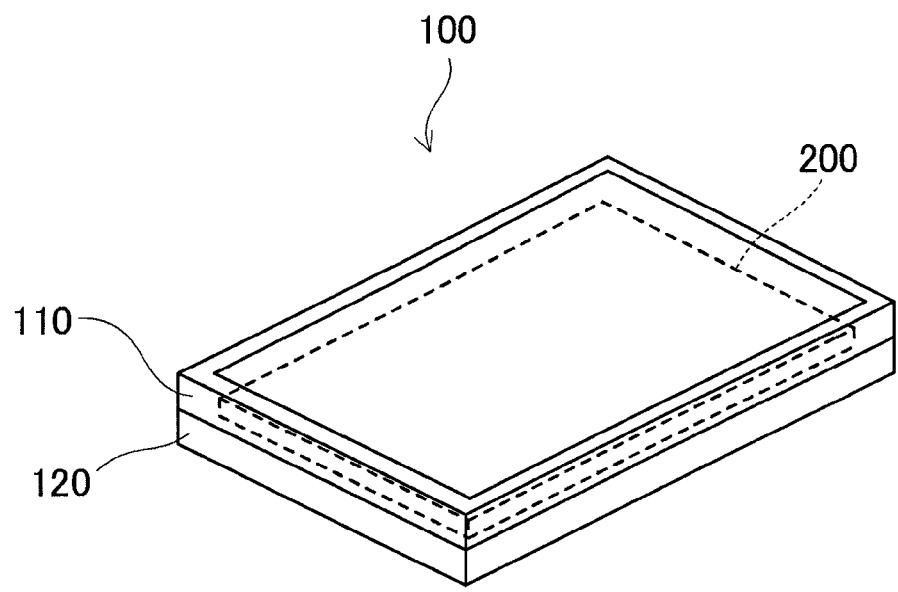
FIG. 1 is a diagram schematically illustrating an organic EL display device according to an embodiment of the present invention.

Hereinafter, a description will be given of embodiments of the present invention with reference to the accompanying drawings.

In the drawings, the same or equivalent elements are denoted by identical symbols, and a repetitive description will be omitted.

FIG. 1 schematically illustrates an organic EL display device 100 according to an embodiment of the present invention. As illustrated in FIG. 1, the organic EL display device 100 includes an organic EL panel 200 fixed between an upper frame 110 and a lower frame 120.

Figure 2:
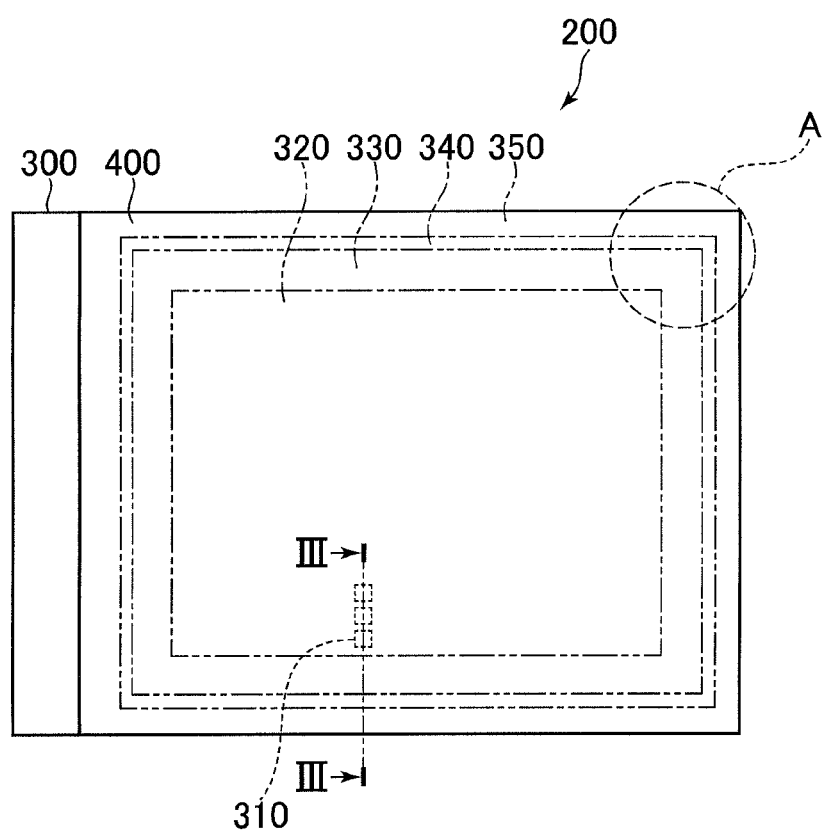
FIG. 2 is a plan view illustrating a configuration of an organic EL panel.

FIG. 2 is a plan view illustrating a configuration of the organic EL panel 200. The organic EL panel 200 includes a TFT substrate 300, and a sealing substrate 400 adhered to the TFT substrate 300 with a transparent resin 410 (to be described later). As illustrated in FIG. 2, the organic EL panel 200 includes a display area 320 in which pixels 310 each having an anode electrode 376 (to be described later) arranged therein, and emitting light on the basis of a gradation value are arrayed in a matrix, a peripheral circuit area 350 that is arranged around the display area 320, and formed with a circuit that applies a potential to various signal generator circuits for driving pixel circuits, and a cathode electrode 378 (to be described later), a blocking area 340 that is formed between the display area 320 and the peripheral circuit area 350, and made of only an inorganic material from the cathode electrode 378 to a glass substrate 371 to thereby block the traffic of moisture, and a blocking inside area 330 formed between the display area 320 and the blocking area 340. Because the moisture penetrated from the external progresses through an organic film, with the provision of the blocking area 340 made of only inorganic material, for example, the moisture that penetrates the peripheral circuit area 350 can be prevented from penetrating the display area 320.

Figure 3:
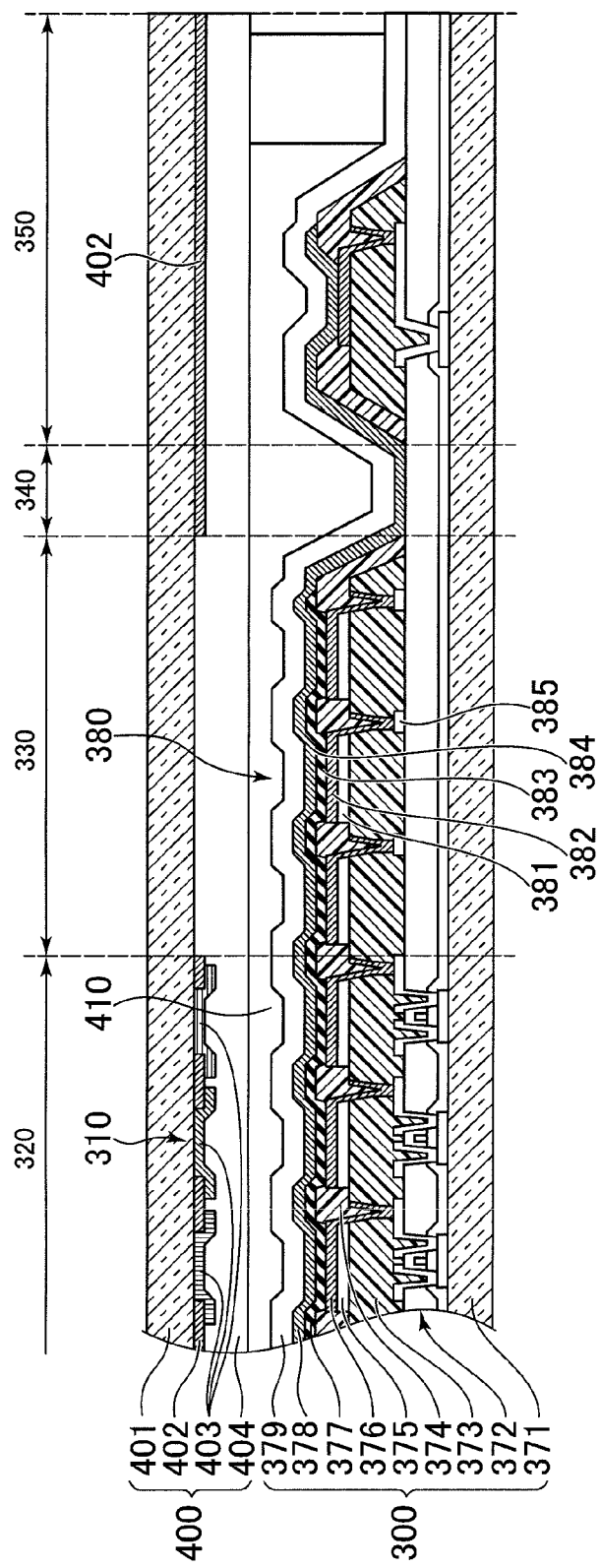
FIG. 3 is a cross-sectional view taken along a line III-III of FIG. 2.

FIG. 3 is a cross-sectional view taken along a line III-III of FIG. 2. As illustrated in FIG. 3, the TFT substrate 300 of the organic EL panel 200 includes the glass substrate 371 which is an insulating substrate, a thin film transistor layer 372 made of, for example, LTPS (low-temperature polysilicon) on the glass substrate 371 in which pixel circuits having transistors and a peripheral circuit are formed, an organic planarizing film 373 that is an organic insulating film for planarizing mainly an area in which the thin film transistor layer 372 are formed, an organic bank 374 that is formed of an organic insulating film formed to cover an end of a conductive film such as an anode electrode 376 formed in each through-hole of the organic planarizing film 373, a reflective film 375 that is arranged on the glass substrate 371 side of the anode electrode 376 for reflecting emitting light, a light emitting organic layer 377 including a light emitting layer that emits light, and/or a hole injection/transport layer, an electron injection/transport layer, a cathode electrode 378 which is an electrode facing the anode electrode 376, and a sealing film 379 that is formed to cover an overall surface of the TFT substrate 300, and formed of an inorganic film or a laminated structure of the inorganic film and an organic film. The inorganic film used for the sealing film 379 is made of SiN or SIC that does not transmit moisture, and formed through CVD (chemical vapor deposition). Also, in this embodiment, the organic bank 374 is formed of an organic insulating film, but may be formed of inorganic insulating film.

Also, the sealing substrate 400 arranged over the TFT substrate 300 through the transparent resin 410 includes a glass substrate 401 which is an insulating substrate. The sealing substrate 400 also includes mainly in the display area 320, color filters 403 of R(red), G(green), and B(blue) that transmit light of given wavelength regions in the respective pixels 310, a black matrix 402 that is a light shielding film for preventing a leakage light from between the respective pixels 310, and an overcoat layer 404 made of an organic material which covers the color filters 403 and the black matrix 402. In this embodiment, the black matrix 402 is formed in the blocking area 340 and the peripheral circuit area 350 outside of the display area 320, and prevents light from being output from those areas, but is not formed in the blocking inside area 330.

In this example, pixel transistors that control the light emission of the respective pixels 310 are arranged in the thin film transistor layer 372 within the display area 320, but the pixel transistor is not arranged in each of dummy pixels 380 arranged in the blocking inside area 330. Also, a reflective film 381, an anode electrode 382, a light emitting organic layer 383, and a cathode 384 in the dummy pixel 380 are laminated on each other in the same process as that of the pixels 310 in the display area 320.

The anode electrode 382 is connected to lines 385 of the thin film transistor layer 372 via through-holes. In this embodiment, the respective dummy pixels 380 are wired to turn on, independently from the pixels 310 in the display area 320, as passive drive pixels. In a test in a manufacturing step, the dummy pixels 380 may sequentially turn on one by one, or plural dummy pixels 380 may turn on together. Also, all of the dummy pixels 380 may turn on at the same time to conduct a test.

In this embodiment, the dummy pixels 380 have a circuit configuration as the passive drive pixels. Alternatively, the pixel transistors are arranged in the same manner as that of the pixels 310 within the display area 320 to perform the active drive, or all of the dummy pixels 380 may be wired to turn on only in unison. Also, in this embodiment, a laminated structure of the light emitting organic layer 383 in the dummy pixels 380 is identical with the laminated structure of the pixels 310 in the display area 320. Alternatively, light may be emitted with a lamination different from the laminated structure of the pixels 310 in the display area.

Figure 4:
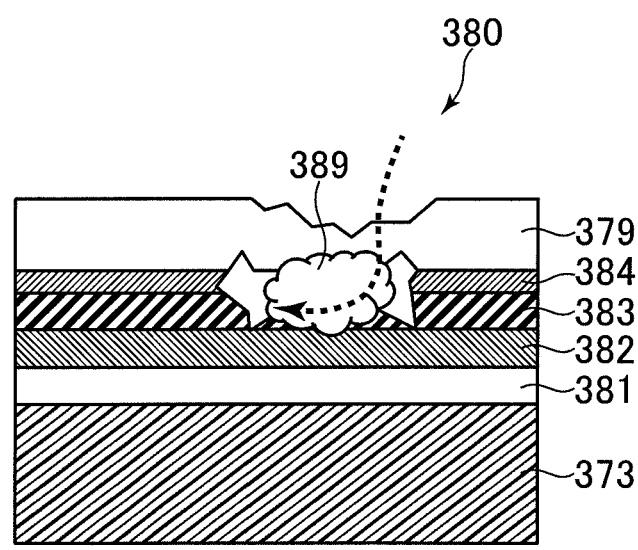
FIG. 4 is a diagram illustrating penetration of moisture into a light emitting organic layer when a foreign matter is mixed into a blocking inside area.

FIG. 4 is a diagram illustrating penetration of moisture into the light emitting organic layer 383 when a foreign matter 389 is mixed into the blocking inside area 330. As illustrated in FIG. 4, for example, if the foreign matter 389 adheres to the TFT substrate 300 in forming the sealing film 379, it is conceivable that the sealing film 379 or the cathode electrode 384 is broken in bonding the TFT substrate 300 to the sealing substrate 400. If the sealing film 379 is broken, or there is a defect in the coating of the sealing film 379, the moisture penetrates the defect, and the moisture spreads through the light emitting organic layer 383. The light emitting organic layer 383 that absorbs the moisture is deteriorated, and becomes dark spot that does not emit light, or weakens the light emission. Therefore, the coating defect of the sealing film 379 in the blocking inside area 330 can be inspected by turning on the dummy pixels 380 in the blocking inside area 330.

Figure 5:
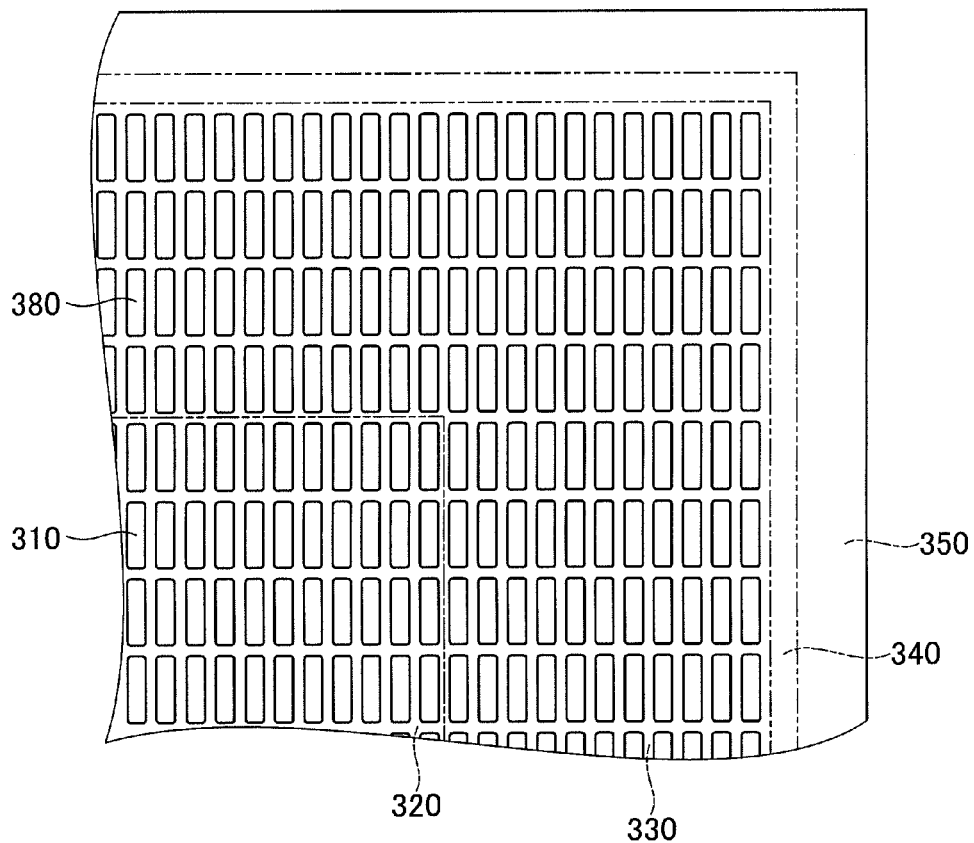
FIG. 5 is an enlarged view illustrating an outline of a layout of pixels and dummy pixels in an area indicated by a mark A in FIG. 2.

FIG. 5 is an enlarged view illustrating an outline of a layout of the pixels 310 and the dummy pixels 380 in an area indicated by a mark A in FIG. 2. As illustrated in FIG. 5, the pixels 310 formed in the display area 320 and the dummy pixels 380 formed in the blocking inside area 330 are formed with the same size and at the same pitches, and the dummy pixels 380 are formed to fill the blocking inside area 330 formed outside of four sides of the display area 320.

As has been described above, in this embodiment, because the blocking inside area 330 in which the dummy pixels 380 are formed is disposed around the display area 320, even if a penetration path of moisture such as the defect of the sealing film is present outside of the display area 320, the penetration path can be easily found out by emitting the light from the dummy pixels 380. As a result, because the lighting failure caused by the dark edge after shipment can be reduced, the life of shipped products can be more lengthened, and the quality can be improved. Also, an aging process for a long term in the inspection before shipping becomes unnecessary, thereby leading to a reduction in the manufacturing costs, and an improvement in the throughput.

Figure 6:
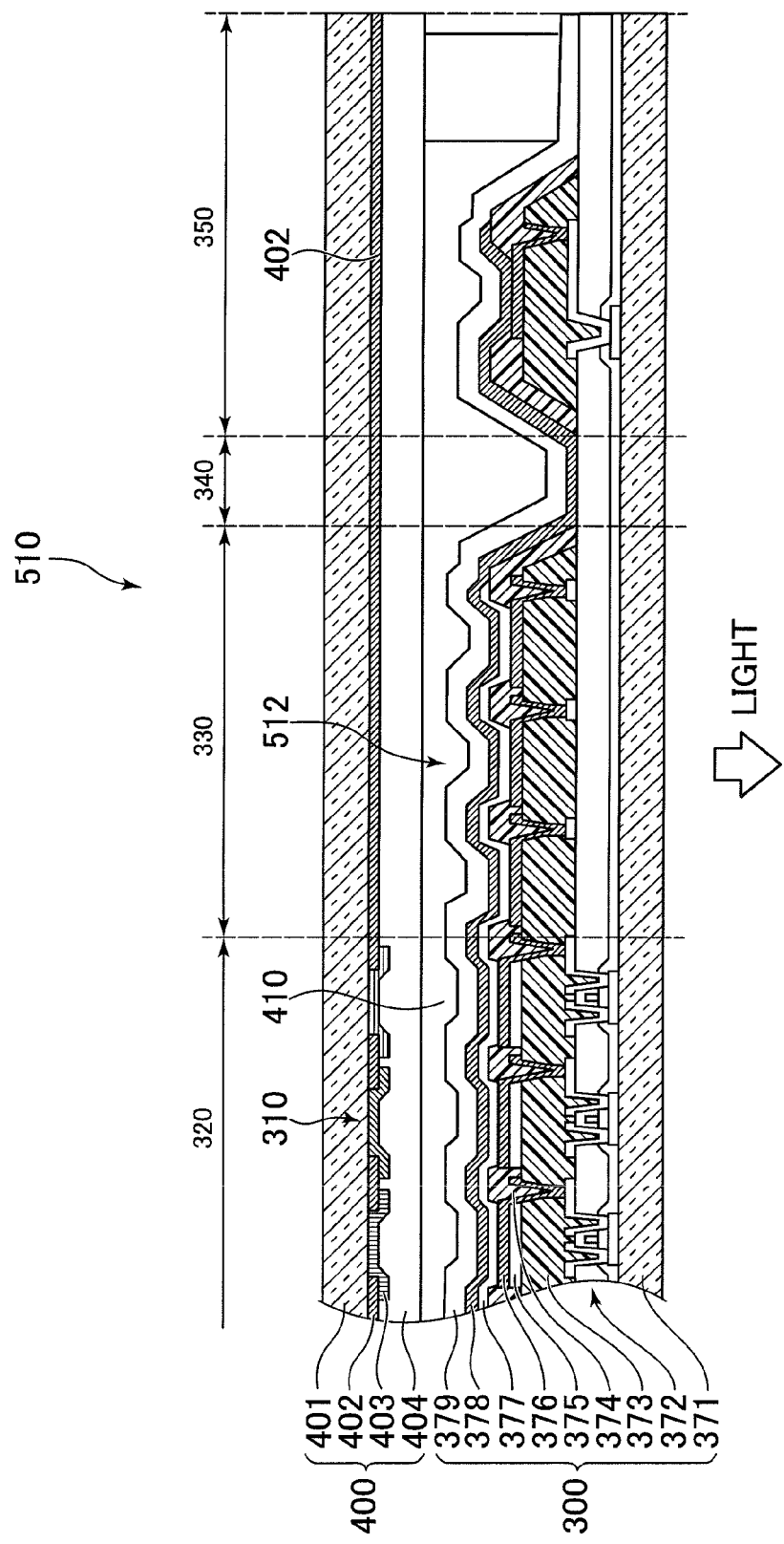
FIG. 6 is a cross-sectional view schematically illustrating an organic EL panel according to a first modification of this embodiment.

FIG. 6 is a cross-sectional view schematically illustrating an organic EL panel 510 according to a first modification of the above embodiment. The first modification is different from FIG. 3 of the above embodiment in that the black matrix 402 on the sealing substrate 400 is also formed in the blocking inside area 330, and the reflective film 375 is not formed in a dummy pixel 512 of the blocking inside area 330. With the above configuration, because the overall outside of the display area 320 is covered with the black matrix 402, a light leakage can be prevented. Also, the light emission from the dummy pixel 512 can be confirmed from the rear surface side of the organic EL panel 510. Therefore, even in the configuration of the organic EL panel 510 in FIG. 6, the same advantage as that in the above embodiment can be obtained. In the first modification, the black matrix 402 is formed in the blocking inside area 330 of the sealing substrate 400. Alternatively, the light emission of the dummy pixel 512 can be visibly recognized from both of the front surface and the rear surface without the formation of the black matrix 402.

Figure 7:
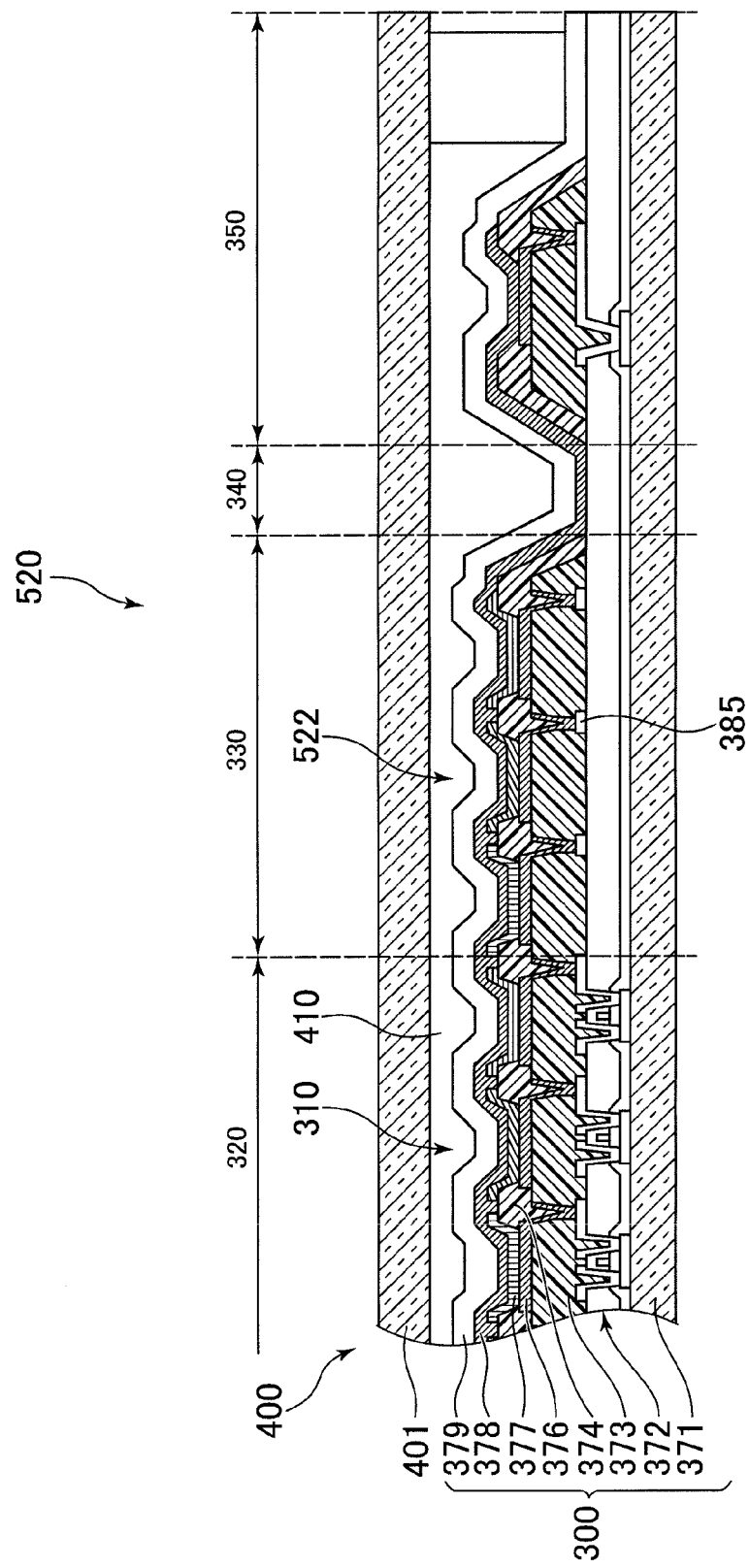
FIG. 7 is a cross-sectional view schematically illustrating an organic EL panel according to a second modification of this embodiment.

FIG. 7 is a cross-sectional view schematically illustrating an organic EL panel 520 according to a second modification of the above embodiment. In the organic EL panel 520, the light emitting organic layer 377 of the respective pixels 310 emit the light of the respective wavelength regions of RGB, and no color filter and no black matrix are formed on the sealing substrate 400. Also, in the second modification, the reflective film 375 is not formed on the pixels 310 in the display area 320, and dummy pixels 522 in the blocking inside area 330. Even with the above configuration, because the light emission of the dummy pixels 522 can be confirmed from a front surface side or a rear surface side of the organic EL panel 520, the same advantages as those in the above embodiment can be obtained. FIG. 7 illustrates an example in which the reflective film 375 is not formed. However, the reflective film 375 may be formed.

Figure 8:
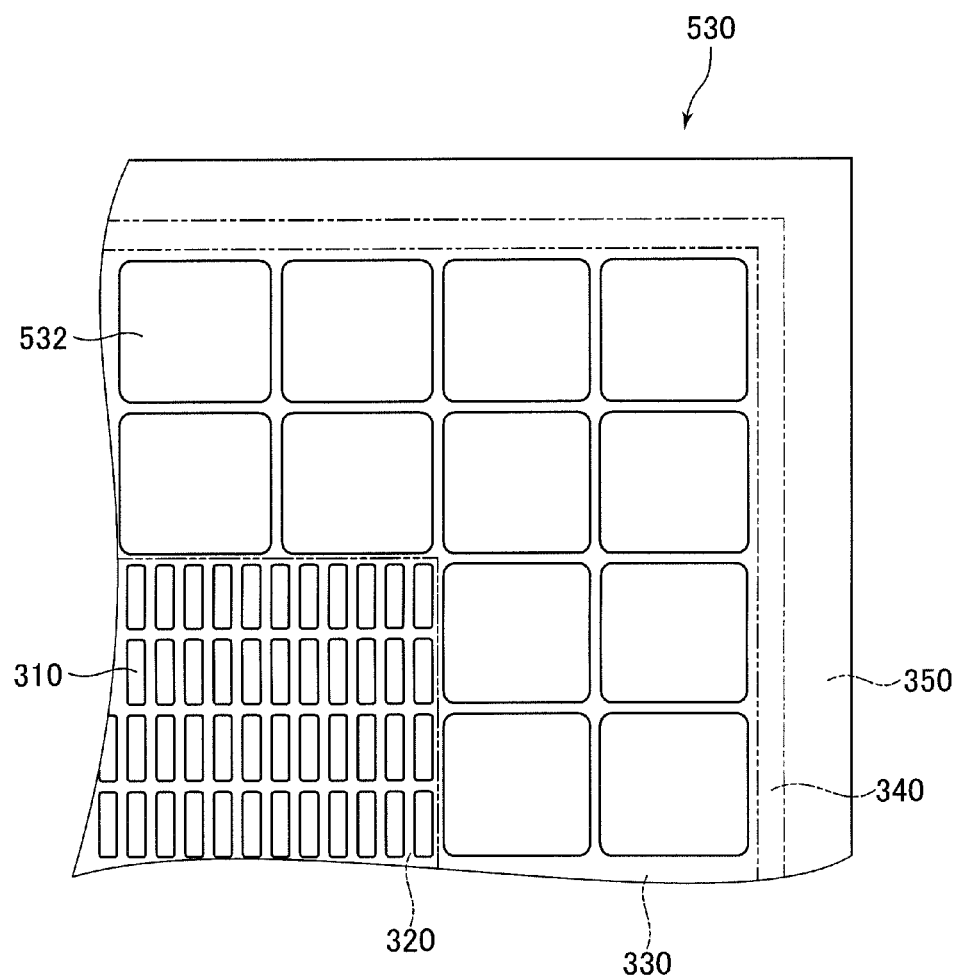
FIG. 8 is an enlarged view illustrating an organic EL panel according to a third modification of this embodiment in the same field of view as that in FIG. 5.
Figure 9:
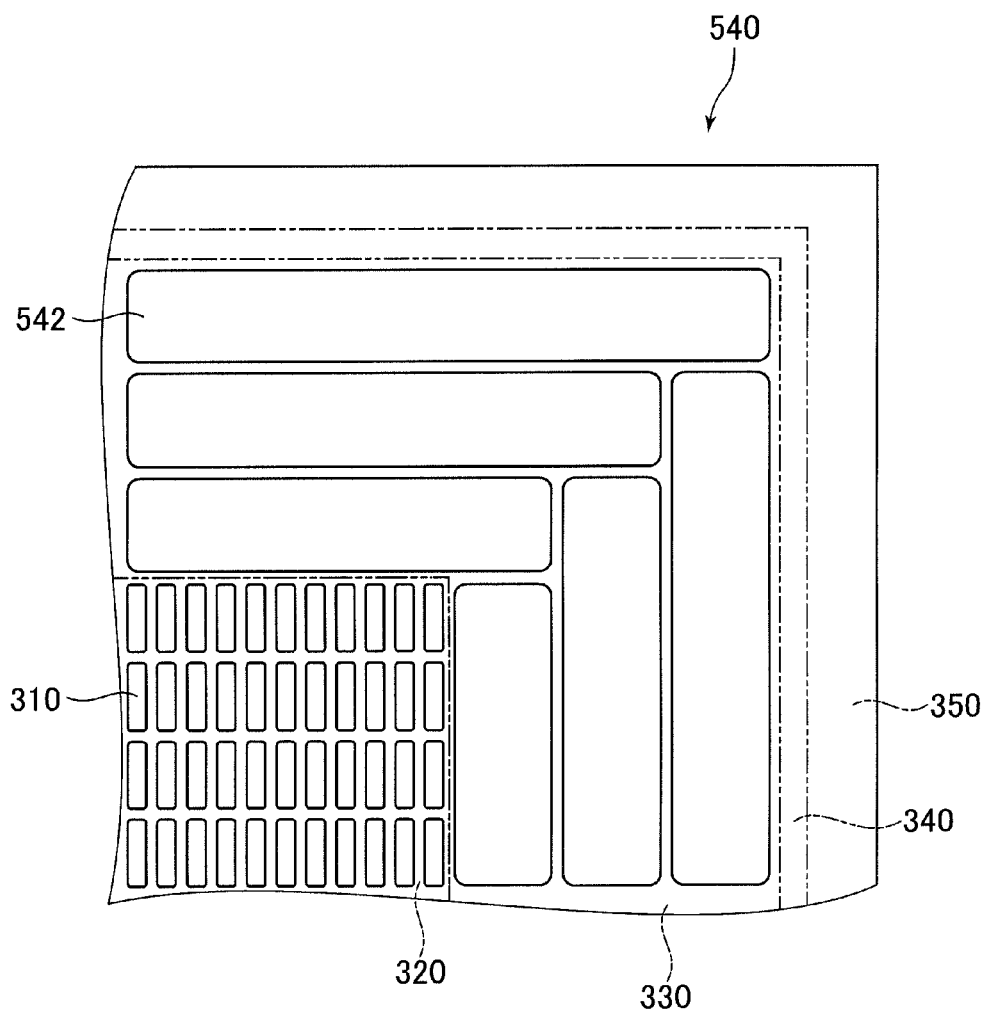
FIG. 9 is an enlarged view illustrating an organic EL panel according to a fourth modification of this embodiment in the same field of view as that in FIG. 5.

FIGS. 8 and 9 are enlarged view illustrating organic EL panels 530 and 540 according to third and fourth modifications of the above embodiments in the same field of view as that in FIG. 5, which are diagrams illustrating a case in which the sizes of dummy pixels 532 and 542 are set to be larger than the pixels 310 in the display area 320. FIG. 8 is a diagram illustrating a case of square dummy pixels 532, and FIG. 9 is a diagram illustrating a case of rectangular dummy pixels 542. Even with the above configuration, the same advantages as those in the above embodiment can be obtained.

When the dummy pixels 532 or 542 turn on through an active drive system in which the pixel transistors are arranged, the number of pixel transistors is suppressed, and the degree of freedom of the layout of the transistors can be enhanced. Also, even in the passive drive system, the number of through-holes for connection to the lines of the thin film transistor layer 372 can be reduced. In the third and fourth modifications, the dummy pixels are set to be larger than the pixels 310 in the display area 320. One dummy pixel that covers the overall blocking inside area 330 can be formed with one common anode electrode whereby one dummy pixel covering the overall blocking inside area 330 may be formed.

In the above respective embodiments, the layout of the anode electrodes 376 and the cathode electrode 378 may be replaced with each other.

An ordinary skilled person can conceive various changes and modifications without departing from the spirit of the present invention, and it should be understood that the modifications and the corrections fall within a scope of the spirit of the invention.

For example, the above respective embodiments appropriately subjected to addition or deletion of components, or design changes by ordinary skilled persons, or subjected to addition or omission of steps, or condition changes also fall within the present invention without departing from the gist of the present invention.

Also, it would be understood that other advantageous effects obtained by the configurations described in the present embodiments are derived from the present invention if they would be apparent from the description of the present specification, or would be appropriately conceived by the ordinary skilled person.

What is claimed is:

1. A display device, comprising:
a display area comprising pixels arranged in a matrix, the pixels each having a light emitting area from which light is emitted;
an inspection area surrounding the display area, the inspection area having at least one inspection pixel;
a plurality of first electrodes in respective pixels of the display area;
a light emitting organic layer in electrical contact with each of the first electrodes of the plurality of first electrodes in the light emitting area, the light emitting organic layer comprises a plurality of organic material layers including a light emitting layer, and the light emitting layer extends from the display area to the inspection area across a boundary between the display area and the inspection area;
a second electrode in the display area, in electrical contact wit the light emitting organic layer, and covering the display area;
an inspection first electrode in the at least one inspection pixel, the inspection first electrodes being in a the same layer as the first electrodes the plurality of first electrodes, and the inspection first electrode is electrically independent from the first electrodes of the plurality of first electrodes;

an inspection organic layer in the at least one inspection pixel, the inspection organic layer being a part of at least the light emitting layer of the organic material layers of the plurality of organic material layers, and in electrical contact with the inspection first electrode; and an inspection second electrode that is continuous from the second electrode, and is in electrical contact with the inspection organic layer, a peripheral circuit area located at an opposite side of the inspection area from the display area and in which a circuit using a metal line and a thin film transistor is arranged; and a blocking area located between the inspection area and the peripheral circuit area, and including an electrode layer, the electrode layer being continuous from the inspection second electrode, wherein, in the blocking area, only inorganic material layers are located between the electrode layer and an insulating substrate which is a base material.

2. The display device according to claim 1,
wherein the inspection pixel has the same size and the same shape as the pixels in the display area, and the inspection pixel is arranged to fill the inspection area at the same interval as the pixels in the display area.

3. The display device according to claim 1,
wherein the inspection pixel is larger than the pixels in the display area, and the inspection pixel fills the inspection area.

4. The display device according to claim 1,
wherein the display area further comprises a reflective layer configured to reflect light emitted by the light emitting layer, and to outputs the light in a first output direction from the first electrodes of the plurality of first electrodes toward the second electrode on a side of the first electrodes of the plurality of first electrodes opposite to a light emitting organic layer side of the first electrodes of the plurality of first electrodes, wherein a light shielding film configured to block light output in the first output direction is arranged in the blocking area and the peripheral circuit area, and covers the electrode layer of the blocking area, and the light shielding film extends from the peripheral circuit area to the blocking area, and does not extend to the inspection area.

5. The display device according to claim 1,
wherein the display area further comprises a reflective layer configured to reflect light emitted by the light emitting layer, to reflect light traveling toward a side of the first electrodes of the plurality of first electrodes opposite to a light emitting organic layer side of the first electrodes of the plurality of first electrodes, and outputs the light in the first output direction from the first electrodes of the plurality of first electrodes toward the second electrode, and wherein the inspection pixel has no layer corresponding to the reflective layer, the inspection pixel is configured to outputs the light in the first output direction, and the inspection pixel is configured to output the light in a second output direction from the second electrode toward the first electrodes.

6. The display device according to claim 5,
wherein the inspection area further comprises a light shielding film that blocks the light output toward the first output direction.

7. The display device according to claim 1,
wherein the inspection first electrode of the inspection pixel is electrically connected to an inspection first electrode of another inspection pixel adjacent thereto.

8. The display device according to claim 1,
wherein the first electrodes of the plurality of first electrodes are each electrically connected with a corresponding pixel transistor configured to control the light emission of the respective pixel with which each first electrode of the plurality of first electrodes is associated.

* * * * *